(12) United States Patent
Lee et al.

(10) Patent No.: US 10,903,435 B2
(45) Date of Patent: Jan. 26, 2021

(54) FLEXIBLE DISPLAY DEVICE

(71) Applicant: DONGWOO FINE-CHEM CO., LTD., Iksan-si (KR)

(72) Inventors: Seungwoo Lee, Hwaseong-si (KR); Inkyu Song, Pyeongtaek-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 16/162,696

(22) Filed: Oct. 17, 2018

(65) Prior Publication Data

US 2019/0115547 A1  Apr. 18, 2019

(30) Foreign Application Priority Data

Oct. 18, 2017 (KR) .................. 10-2017-0135455
Jul. 20, 2018 (KR) .................. 10-2018-0084717

(51) Int. Cl.

| H01L 51/00 | (2006.01) |
|---|---|
| H01L 51/52 | (2006.01) |
| B32B 7/12 | (2006.01) |
| H01L 27/32 | (2006.01) |
| C09J 183/04 | (2006.01) |
| B32B 27/08 | (2006.01) |
| H01L 51/56 | (2006.01) |

(52) U.S. Cl.
CPC ............ *H01L 51/0097* (2013.01); *B32B 7/12* (2013.01); *B32B 27/08* (2013.01); *C09J 183/04* (2013.01); *H01L 27/3232* (2013.01); *H01L 51/0001* (2013.01); *H01L 51/524* (2013.01); *H01L 51/5293* (2013.01); *H01L 51/56* (2013.01); *H01L 27/323* (2013.01); *H01L 51/5281* (2013.01); *H01L 2251/5338* (2013.01)

(58) Field of Classification Search
CPC ............. H01L 51/0097; H01L 51/0001; H01L 51/5293; H01L 51/56; H01L 27/3232; B32B 7/12; B32B 27/08; C09J 183/04
USPC .................... 345/173, 178; 348/552; 257/40; 428/189; 361/749
See application file for complete search history.

(56) References Cited

U.S. PATENT DOCUMENTS

| 5,849,944 | A  * | 12/1998 | Allen ...................... C08G 18/10 560/26 |
|---|---|---|---|
| 8,449,970 | B2 * | 5/2013 | Pellerite ................... G02B 1/14 428/212 |
| 9,323,361 | B2 * | 4/2016 | Han ........................ G06F 3/041 |

(Continued)

FOREIGN PATENT DOCUMENTS

| KR | 10-2012-0076026 A | 7/2012 |
|---|---|---|
| KR | 10-2013-0130698 A | 12/2013 |

(Continued)

*Primary Examiner* — Prabodh M Dharia
(74) *Attorney, Agent, or Firm* — Sughrue Mion, PLLC

(57) ABSTRACT

A flexible display device is disclosed. The flexible display device includes a display panel; a functional structure disposed on the display panel; a window disposed on the functional structure; a first adhesive layer formed between the display panel and the functional structure; and a second adhesive layer formed between the functional structure and the window, wherein the first adhesive layer and the second adhesive layer have a tan δ of 0.8 to 1 at −20° C. The flexible display device is excellent in bending resistance and durability while including a plurality of layers.

8 Claims, 4 Drawing Sheets

(56) References Cited

U.S. PATENT DOCUMENTS

| | | | |
|---|---|---|---|
| 9,736,931 B2* | 8/2017 | Eom | H05K 5/0017 |
| 2007/0172649 A1* | 7/2007 | Aihara | C09J 7/381 |
| | | | 428/343 |
| 2011/0236699 A1* | 9/2011 | Heikkila | C08K 5/0091 |
| | | | 428/457 |
| 2013/0098663 A1* | 4/2013 | Nagata | G06F 3/044 |
| | | | 174/251 |
| 2013/0196142 A1* | 8/2013 | Yamamoto | C09J 7/22 |
| | | | 428/317.3 |
| 2013/0251991 A1* | 9/2013 | Sakurai | B32B 27/12 |
| | | | 428/355 AC |
| 2014/0017467 A1* | 1/2014 | Inao | C08G 18/10 |
| | | | 428/214 |
| 2014/0184053 A1* | 7/2014 | Cho | C09J 7/10 |
| | | | 313/112 |
| 2015/0056417 A1* | 2/2015 | Yamazki | B32B 37/02 |
| | | | 428/189 |
| 2015/0129845 A1* | 5/2015 | Kim | H01L 51/5256 |
| | | | 257/40 |
| 2015/0148491 A1* | 5/2015 | Kapur | C08L 23/08 |
| | | | 525/240 |
| 2015/0160390 A1* | 6/2015 | Goyal | G02B 5/3033 |
| | | | 348/552 |
| 2015/0207102 A1* | 7/2015 | Jeong | H01L 27/323 |
| | | | 257/40 |
| 2016/0037656 A1* | 2/2016 | Kim | G06F 1/1656 |
| | | | 361/749 |
| 2016/0155913 A1* | 6/2016 | Maki | H01L 27/156 |
| | | | 257/88 |
| 2016/0237319 A1* | 8/2016 | Takarada | G02B 5/3025 |
| 2016/0339672 A1* | 11/2016 | Kagiyama | C08G 18/4238 |
| 2017/0226384 A1* | 8/2017 | Kawamoto | C09J 7/22 |
| 2017/0335174 A1* | 11/2017 | Blattel | C09K 8/725 |
| 2018/0001599 A1* | 1/2018 | Mikayama | B32B 17/10761 |
| 2018/0101253 A1* | 4/2018 | He | G06F 3/03547 |
| 2018/0354229 A1* | 12/2018 | Onishi | G09F 9/00 |
| 2018/0370186 A1* | 12/2018 | Everaerts | B32B 3/18 |
| 2019/0386247 A1* | 12/2019 | Choi | H01L 51/00 |

FOREIGN PATENT DOCUMENTS

| | | |
|---|---|---|
| KR | 10-2015-0084257 A | 7/2015 |
| KR | 10-2015-0084260 A | 7/2015 |
| KR | 10-1579710 B1 | 12/2015 |
| KR | 10-1645066 B1 | 8/2016 |

* cited by examiner

【FIG. 1】
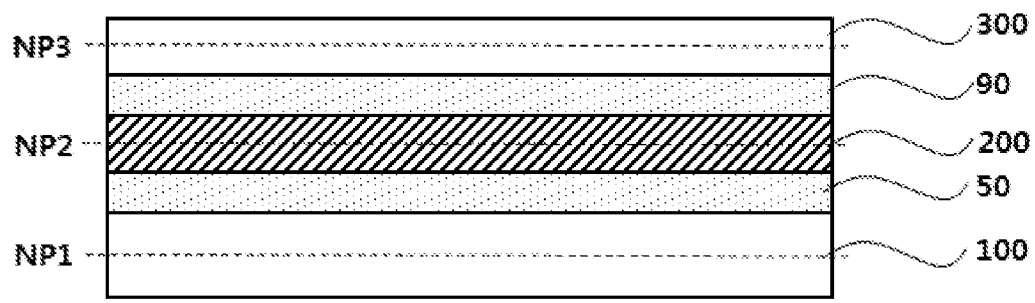
【FIG. 2】
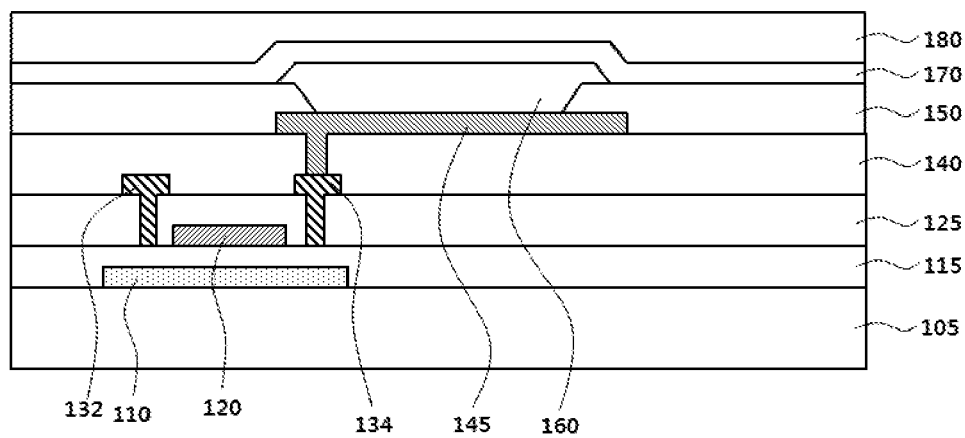

【FIG. 3】
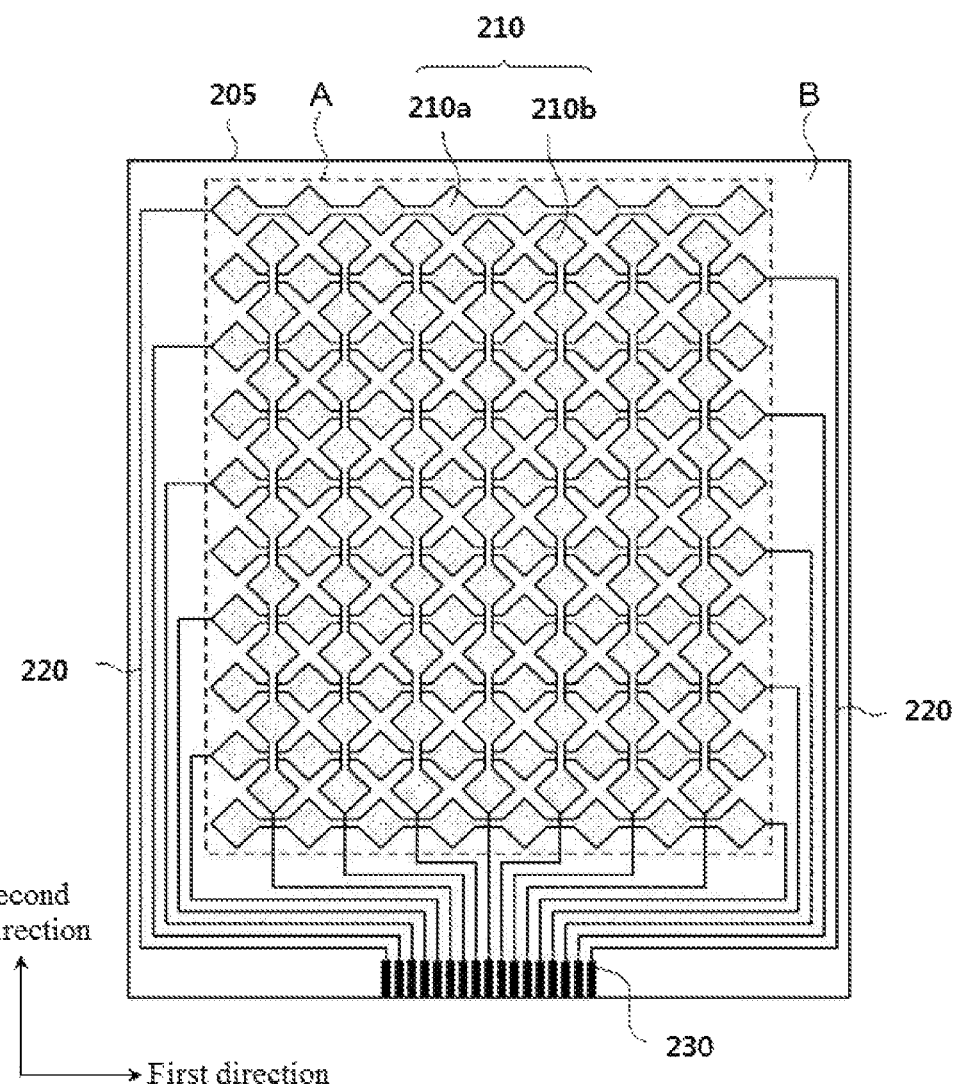

【FIG. 4】
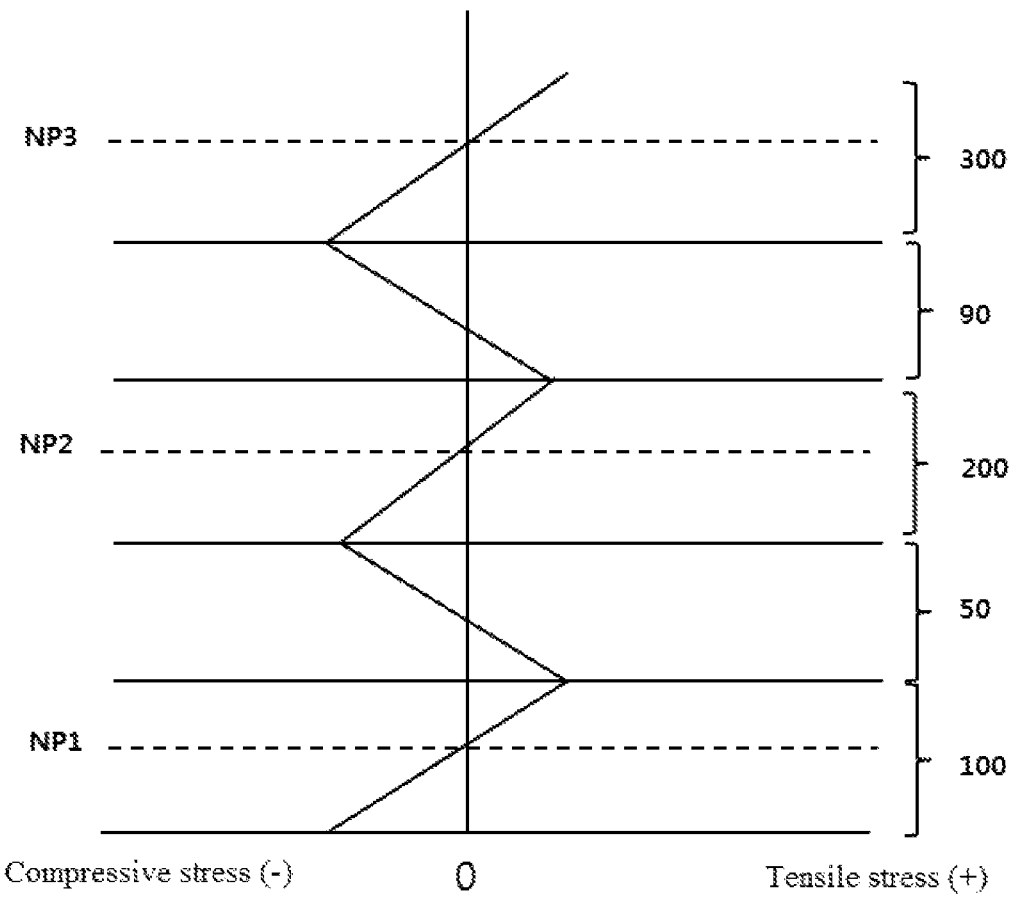
【FIG. 5】
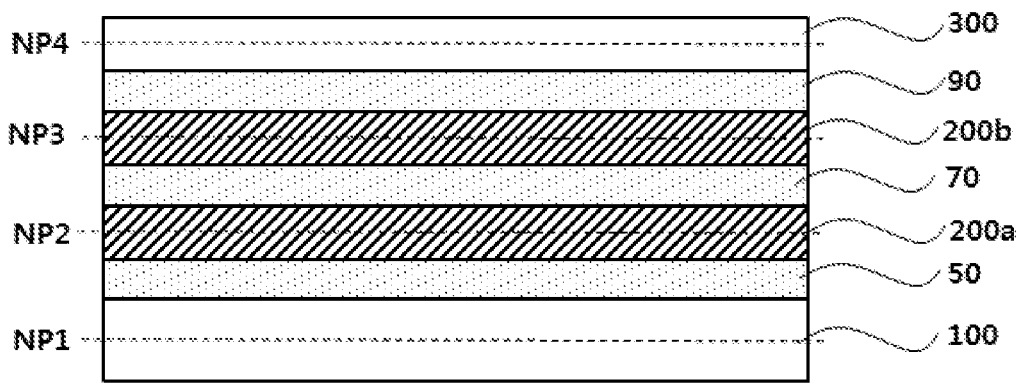

[FIG. 6]
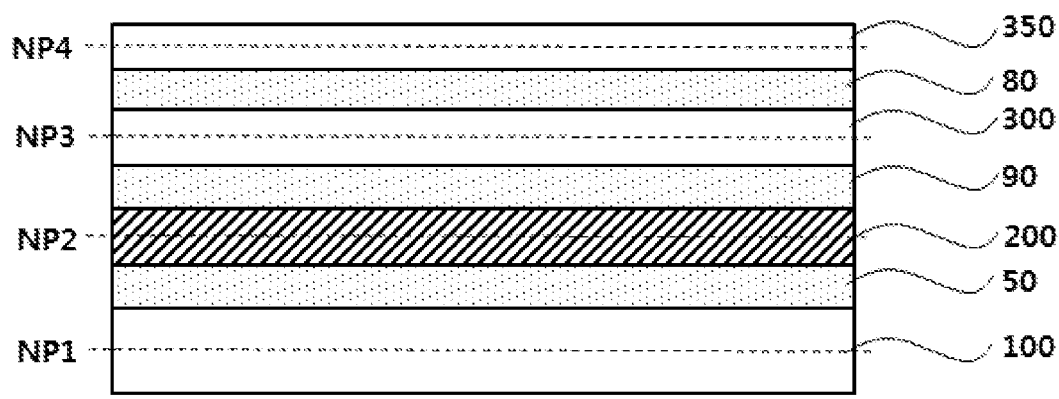

FLEXIBLE DISPLAY DEVICE

CROSS REFERENCE TO RELATED APPLICATIONS

The instant application claims priority based on Korean Patent Application No. 10-2017-0135455 filed Oct. 18, 2017 and Korean Patent Application No. 10-2018-0084717 filed Jul. 20, 2018, the entire contents of which are hereby incorporated by reference.

TECHNICAL FIELD

The present relates to a flexible display device. More specifically, the present invention relates to a flexible display device having excellent bending resistance and durability while including a plurality of layers.

BACKGROUND ART

Recently, the display market is rapidly changing based on flat panel displays that are easy to fabricate over a large area and can be reduced in weight. These flat panel displays include a liquid crystal display (LCD), a plasma display panel (PDP), an organic light emitting display (OLED) and the like.

A window substrate for protecting the display panel from an external environment may be disposed on the upper part of the display panel. The window substrate and the display panel may be formed of, for example, a transparent plastic material having flexibility, as the flexible display is being recently developed. Further, additional elements of a display device such as a polarizing plate, a touch screen panel and the like may be disposed between the window substrate and the display panel.

For example, Korean Patent Laid-open Publication No. 2012-0076026 discloses a touch screen panel including a transparent substrate and a polarizing plate.

However, as a plurality of layers such as a polarizing plate, a touch screen panel, and a window substrate are laminated on a display panel, sufficient bending resistance and durability required for a flexible display device may not be realized. Therefore, there is a need to develop a flexible display device with a multi-layered structure having excellent durability while ensuring sufficient bending resistance to prevent damage such as cracks or breakage in each layer during bending or folding operation.

DETAILED DESCRIPTION OF THE INVENTION

Technical Problem

It is one object of the present invention to provide a flexible display device having excellent bending resistance and durability while including a plurality of layers.

Technical Solution

In accordance with one aspect of the present invention, the present invention provides a flexible display device comprising: a display panel; a functional structure disposed on the display panel; a window disposed on the functional structure; a first adhesive layer formed between the display panel and the functional structure; and a second adhesive layer formed between the functional structure and the window, wherein the first adhesive layer and the second adhesive layer have a tan δ of 0.8 to 1 at −20° C.

In one embodiment of the present invention, the display panel may comprise an organic light emitting diode (OLED) panel or a liquid crystal display (LCD) panel.

In one embodiment of the present invention, the functional structure may comprise at least one of a touch sensor, a polarizing layer, and a retardation layer.

Advantageous Effects

As the flexible display device according to the present invention has a multi-layered structure and the tan δ of the adhesive layers between respective layers is controlled to be 0.8 to 1 at −20° C., the minimum bending deformation and stress are applied to the respective layers and the durability is excellent while ensuring sufficient bending resistance.

BRIEF DESCRIPTION OF THE DRAWINGS

FIG. 1 is a cross-sectional view schematically illustrating the flexible display device according to one embodiment of the present invention.

FIG. 2 is a cross-sectional view schematically illustrating the display panel of the flexible display device according to one embodiment of the present invention.

FIG. 3 is a plan view schematically illustrating the touch sensor of the flexible display device according to one embodiment of the present invention.

FIG. 4 is a graph illustrating a strain profile of the flexible display device according to one embodiment of the present invention.

FIG. 5 is a cross-sectional view schematically illustrating the flexible display device according to another embodiment of the present invention.

FIG. 6 is a cross-sectional view schematically illustrating the flexible display device according to still another embodiment of the present invention.

DETAILED DESCRIPTION OF THE EMBODIMENTS

Hereinafter, the present invention will be described in detail with reference to the accompanying drawings.

FIG. 1 is a cross-sectional view schematically illustrating the flexible display device according to one embodiment of the present invention.

Referring to FIG. 1, the flexible display device may comprise a display panel 100, a functional structure 200 and a window 300.

The display panel 100 may comprise, for example, an organic light emitting diode (OLED) panel or a liquid crystal display (LCD) panel. The detailed configuration and structure of the display panel 100 will be described below with reference to FIG. 2.

The functional structure 200 may, for example, comprise at least one of a touch sensor, a polarizing layer, and a retardation layer. The detailed configuration and structure of the touch sensor will be described below with reference to FIG. 3.

The functional structure 200 may have a thickness of 50 to 150 μm.

The polarizing layer may be provided, for example, as a polarizing plate including a stretched polarizer. In this case, the polarizing plate may include a polarizer and a protective film formed on at least one side of the polarizer.

The stretched polarizer may include, for example, a stretched polyvinyl alcohol (PVA)-based resin. The polyvinyl alcohol-based resin may be preferably a polyvinyl alcohol-based resin obtained by saponifying a polyvinyl acetate-based resin. The polyvinyl acetate-based resin may include a copolymer of vinyl acetate and other monomers copolymerizable therewith, in addition to polyvinyl acetate which is a homopolymer of vinyl acetate. The other monomers may include an unsaturated carboxylic acid-based monomer, an unsaturated sulfonic acid-based monomer, an olefin-based monomer, a vinyl ether-based monomer, an ammonium group-containing acrylamide-based monomer, or the like. In addition, the polyvinyl alcohol-based resin may be modified, and for example, it may be a polyvinyl formal or a polyvinyl acetal modified with an aldehyde.

The protective film may include, for example, polyester-based resins such as polyethylene terephthalate, polyethylene isophthalate, polyethylene naphthalate, polybutylene terephthalate and the like; cellulose-based resins such as diacetyl cellulose, triacetyl cellulose and the like; polycarbonate-based resins, acryl-based resins such as polymethyl (meth)acrylate, polyethyl (meth)acrylate and the like; cyclic olefin-based polymers (COP), and the like.

The polarizing layer may include a coating type polarizer. In this case, the polarizing layer may be directly coated onto the touch sensor, and the functional structure 200 may include a laminated structure of the touch sensor and the polarizing layer. For example, the polarizing layer may include an alignment film and a liquid crystal layer formed on the alignment film.

For example, an alignment film coating composition comprising an aligning polymer, a photopolymerization initiator and a solvent is coated and cured on the touch sensor to form an alignment film, and then a liquid crystal coating composition is coated and cured on the alignment film to form a polarizing layer containing an alignment film and a liquid crystal layer.

The aligning polymer may include, for example, a polyacrylate-based resin, a polyamic acid resin, a polyimide-based resin, a polymer containing a cinnamate group, and the like. The liquid crystal coating composition may comprise a reactive liquid crystal compound and a dichroic dye.

The retardation layer may be a coating layer or a film. The retardation layer may be provided by integration with the polarizing layer.

The retardation layer may be a single layer or a multi-layer. In the case of a single layer, it may be a ¼ wave plate, and in the case of a multi-layer, it may be a multi-layer having a ¼ wave plate and a ½ wave plate, but is not limited thereto. In the case of the multi-layer having a ¼ wave plate and a ½ wave plate, the color sense and image quality are excellent due to phase difference correction when applied to a display device.

The window 300 may be exposed, for example, to the user viewing side of the flexible display device and thus be provided as a protective film for an external environment.

The window 300 may comprise a substrate layer containing a plastic material or a polymeric material having flexibility. For example, the substrate layer may include polyimide (PI), polyethersulfone (PES), polyacrylate (PAR), polyetherimide (PEI), polyethylene napthalate (PEN), polyethylene terephthalate (PET), polyphenylene sulfide (PPS), polyazylate, polycarbonate (PC), cellulose triacetate (TAC), cellulose acetate propionate (CAP) and the like. In particular, among them, polyimide is preferable. They may be used alone or in combination of two or more thereof.

The window 300 may further comprise a hard coating layer formed on at least one side of the substrate layer. The hard coating layer may be formed using a hard coating composition comprising, for example, a photocurable compound, a photoinitiator and a solvent, thereby further securing excellent flexibility, abrasion resistance and surface hardness of the window 300.

The photocurable compound may include, for example, a siloxane-based compound, an acrylate-based compound, a compound having a vinyl group, and the like. They may be used alone or in combination of two or more thereof.

The photoinitiator is not particularly limited as long as it initiates a polymerization reaction of the photocurable compound, for example, by generating an ion, a Lewis acid or a radical by irradiation of an active energy ray such as visible light, ultraviolet light, X-ray or electron beam. Examples of the photoinitiator include onium salts such as aromatic diazonium salts, aromatic iodonium salts or aromatic sulfonium salts, acetophenone compounds, benzoin compounds, benzophenone compounds, thioxanthone compounds and the like.

The window 300 may have a thickness of 50 to 100 μm.

According to one embodiment of the present invention, a first adhesive layer 50 may be formed between the display panel 100 and the functional structure 200. In one embodiment, the first adhesive layer 50 may make a direct contact with the surfaces of the display panel 100 and the functional structure 200. For example, the first adhesive layer 50 may be formed on the bottom surface of the functional structure 200 (for example, the touch sensor, the polarizing layer or the retardation layer), and then the exposed surface of the first adhesive layer 50 may be adhered to the upper surface of the display panel 100.

A second adhesive layer 90 may be formed between the functional structure 200 and the window 300. In one embodiment, the second adhesive layer 90 may make a direct contact with the surfaces of the functional structure 200 and the window 300. For example, the second adhesive layer 90 may be formed on the bottom surface of the window 300, and then the exposed surface of the second adhesive layer 90 may be adhered to the upper surface of the functional structure 200.

As used herein, the term "adhesive layer" refers to including a layer formed by an adhesive, as well as a layer formed by a tackifier. The adhesive layer may be formed using a pressure sensitive adhesive (PSA) composition or an optically clear adhesive (OCA) composition.

The first and second adhesive layers 50, 90 may have a viscoelastic property applicable to a flexible display while having an appropriate adhesive strength so as not to cause peeling, bubbles, or the like when bending occurs on the flexible display device.

In the flexible display device according to one embodiment of the present invention, the first and second adhesive layers 50, 90 have a tan δ of 0.8 to 1 at −20° C.

The value of tangent delta (Tan δ) refers to a ratio of loss elastic modulus (G″)/storage elastic modulus (G′) of the adhesive layers and is an index indicating easy deformation of the adhesive layers. In the present invention, the method for measuring the value of tangent delta of the adhesive layers is not particularly limited, and for example, it can be measured by the method described in Experimental Examples described below.

In one embodiment of the present invention, the value of tangent delta of the first and second adhesive layers 50, 90 is controlled to be 0.8 to 1 at a low temperature of −20° C., thereby improving the bending resistance and durability of the flexible display device comprising the first and second adhesive layers 50,90.

In addition, the first and second adhesive layers 50, 90 may each have a storage elastic modulus (G') of 0.05 to 0.15 MPa at −20° C.

If the storage elastic modulus of the first and second adhesive layers 50, 90 is less than 0.05 MPa at −20° C., the durability may be deteriorated, and if the storage elastic modulus is greater than 0.15 MPa, the bending resistance may be deteriorated.

The thickness of the first and second adhesive layers 50, 90 may each be 20 to 200 μm, and preferably 20 to 100 μm.

The storage elastic modulus at −20° C. and thickness of the first and second adhesive layers 50, 90 may be the same or different.

The tan δ and the storage elastic modulus of the first and second adhesive layers 50, 90 at −20° C. may be controlled, for example, by changing composition of adhesive compositions for forming these layers.

The first and second adhesive layers 50, 90 may be formed using an acrylic-based, a silicone-based, or a urethane-based adhesive composition.

In one embodiment of the present invention, the first and second adhesive layers 50, 90 may be formed from an adhesive composition comprising a (meth)acrylate resin, a (meth)acrylate ester monomer and a photoinitiator.

In particular, the first and second adhesive layers 50, 90 may be formed from an adhesive composition comprising an aliphatic (meth)acrylate polymer, a (meth)acrylate ester monomer and a photoinitiator.

The aliphatic (meth)acrylate polymer is a component which serves to control the viscosity-to-elasticity balance of the adhesive composition, and for example, it may be an alkyl (meth)acrylate monomer, in particular, a polymer of $C_4$-$C_8$ alkyl (meth)acrylate monomers.

Specific examples of the alkyl (meth)acrylate monomer include n-butyl (meth)acrylate, 2-butyl (meth)acrylate, t-butyl (meth)acrylate, 2-ethylhexyl (meth)acrylate, ethyl (meth)acrylate, methyl (meth)acrylate, n-propyl (meth)acrylate, isopropyl (meth)acrylate, n-pentyl (meth)acrylate, n-octyl (meth)acrylate, isooctyl (meth)acrylate and the like. Among them, a $C_4$-$C_8$ alkyl(meth)acrylate monomer such as n-butyl (meth)acrylate and 2-ethylhexyl (meth)acrylate may be preferably used. They may be used alone or in a combination of two or more thereof.

The method of preparing the aliphatic (meth)acrylate polymer is not particularly limited, and a bulk polymerization, an emulsion polymerization, a suspension polymerization or the like which is commonly used in the art may be used, and the bulk polymerization is preferable. In addition, a polymerization initiator commonly used during polymerization, a chain transfer agent for controlling the molecular weight, or the like may be used.

The aliphatic (meth)acrylate polymer may be a partial polymer in which the above-described monomers are partially polymerized.

Such a partial polymer may appear in a syrup form (viscous liquid phase) in which the polymer formed from a part of the monomer and the unreacted monomer coexist. Thus, the partial polymer having such a property is sometimes referred to as a polymer syrup.

The method of partially polymerizing the monomer is not particularly limited, and various polymerization methods may be appropriately selected and used. For example, photopolymerization or thermal polymerization methods may be used.

The solid content of the partial polymer, that is, the polymer syrup, may be 20 to 60 wt %, and preferably 30 to 50 wt %. If the solid content of the polymer syrup is less than 20 wt %, the durability of the adhesive composition may be deteriorated, and if the solid content is higher than 60 wt %, the coating property of the adhesive composition may be deteriorated.

The solid content of the polymer syrup is equal to the amount of polymer formed. For example, if the solid content is 40 wt %, the amount of the polymer formed is 40 wt % based on 100 wt % of the total weight of the polymer syrup.

In one embodiment of the present invention, the aliphatic (meth)acrylate polymer may be contained in an amount of 30 to 50 wt % based on 100 wt % of the total weight of the adhesive composition. If the aliphatic (meth)acrylate polymer is contained in an amount less than 30 wt %, the durability of the adhesive composition may be deteriorated, and if it is contained in an amount exceeding 50 wt %, the coating property of the adhesive composition may be deteriorated.

The (meth)acrylate ester monomer is a component that can function as a dispersion medium for the aliphatic (meth)acrylate polymer and can be polymerized by the action of a photoinitiator.

The (meth)acrylate ester monomer may include an alkyl (meth)acrylate used in the preparation of the aliphatic (meth) acrylate polymer.

In addition, the (meth)acrylate ester monomer may further include a $C_{10}$-$C_{20}$ alkyl (meth)acrylate.

Specific examples of the $C_{10}$-$C_{20}$ alkyl (meth)acrylate include decyl (meth)acrylate, isodecyl (meth)acrylate, undecyl (meth)acrylate, lauryl (meth)acrylate, tridecyl (meth)acrylate and the like. They may be used alone or in combination of two or more thereof.

In one embodiment of the present invention, the (meth) acrylate ester monomer may be contained in an amount of 45 to 70 wt % based on 100 wt % of the total weight of the adhesive composition. If the content of the (meth)acrylate ester monomer satisfies the above-mentioned range, the tan δ and the storage elastic modulus at −20° C. can be controlled within an appropriate range.

The photoinitiator may be used without particular limitation as long as it is an initiator being used in the art. The photoinitiator is a Type I photoinitiator in which radicals are generated by decomposition of molecules due to a difference in chemical structure or molecular binding energy, and a Type II (hydrogen abstraction type) photoinitiator in which tertiary amines are incorporated as a co-initiator. Specific examples of the Type I photoinitiator may include acetophenones such as 4-phenoxydichloroacetophenone, 4-t-butyldichloroacetophenone, 4-t-butyltrichloroacetophenone, diethoxyacetophenone, 2-hydroxy-2-methyl-1-phenylpropan-1-one, 1-(4-isopropylphenyl)-2-hydroxy-2-methylpropan-1-one, 1-(4-dodecylphenyl)-2-hydroxy-2-methylpropan-1-one, 4-(2-hydroxyethoxy)-phenyl(2-hydroxy-2-propyl)ketone, 1-hydroxycyclohexyl phenyl ketone or the like, benzoins such as benzoin, benzoin methyl ether, benzoin ethyl ether, benzyl dimethyl ketal or the like, acylphosphine oxides, and titanocene compounds Specific examples of the Type II photoinitiator may include benzophenones such as benzophenone, benzoyl benzoic acid. benzoyl benzoic acid methyl ether, 4-phenylbenzophenone, hydroxybenzophenone, 4-benzoyl-4'-methyldiphenylsulfide, 3,3'-methyl-4-methoxybenzophenone or the like, and thioxanthones such as thioxanthone, 2-chlorothioxanthone, 2-methylthioxanthone, 2,4-dimethylthioxanthone, isopropylthioxanthone or the like. These photoinitiators may be used alone or in combination of two or more. In addition, Type I photoinitiator and Type II photoinitiator may be used alone or in combination.

The photoinitiator may be contained in an amount of 0.01 to 5.0 wt % based on 100 wt % of the total weight of the adhesive composition. If the photoinitiator is contained in an amount less than 0.01 wt %, it may be difficult to effectively initiate the cross-linking reaction, and if it is contained in an amount exceeding 5.0 wt %, discoloration or the like may occur due to residual initiator, thereby causing a deterioration of durability.

In one embodiment of the present invention, the first and second adhesive layers 50, 90 may be formed from an adhesive composition comprising a silicone urethane (meth) acrylate resin, a (meth)acrylate ester monomer and a photoinitiator.

The silicone urethane (meth)acrylate resin may be a resin having a silicon bond (—Si—O—) and a urethane group in the molecule and having a (meth)acryloyloyloxy terminal group.

The silicone urethane (meth)acrylate resin may be a reaction product of a polysilicon having hydroxyl groups at both ends, a polyisocyanate, and a (meth)acrylate having a hydroxyl group.

The polysilicon having hydroxyl groups at both ends may be a compound represented by Chemical Formula 1.

[Chemical Formula 1]

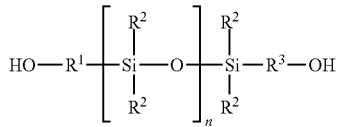

wherein.

$R^1$ and $R^3$ are each independently a $C_1$-$C_{10}$ alkylene group or a $C_1$-$C_{10}$ oxyalkylene group, $R^2$ is a $C_1$-$C_{10}$ alkyl group, a $C_3$-$C_{10}$ cycloalkyl group or an aryl group, and n is an integer of 1 to 30.

As used herein, the $C_1$-$C_{10}$ alkylene group refers to a linear or branched divalent hydrocarbon having 1 to 10 carbon atoms, and examples thereof include methylene, ethylene, propylene, butylene, pentylene and the like, but are not limited thereto.

As used herein, the $C_1$-$C_{10}$ oxyalkylene group refers to a functional group in which at least one carbon chain in a linear or branched divalent hydrocarbon having 1 to 10 carbon atoms is substituted with oxygen, and examples thereof include ethyloxypropyl, propyloxyethyl, and the like, but are not limited thereto.

As used herein, the $C_1$-$C_{10}$ alkyl group refers to a linear or branched monovalent hydrocarbon having 1 to 10 carbon atoms, and examples thereof include methyl, ethyl, n-propyl, i-propyl, n-butyl, i-butyl, t-butyl, n-pentyl, n-hexyl, and the like, but are not limited thereto.

As used herein, the $C_3$-$C_{10}$ cycloalkyl group refers to a simple or fused ring hydrocarbon having 3 to 10 carbon atoms, and examples thereof include cyclopropyl, cyclobutyl, cyclopentyl, cyclohexyl and the like, but are not limited thereto.

As used herein, the aryl group includes all of aromatic groups, heteroaromatic groups and partially-reduced derivatives thereof. The aromatic group refers to a 5 to 15-membered simple or fused ring, and the heteroaromatic group refers to an aromatic group containing at least one of oxygen, sulfur or nitrogen. Typical examples of the aryl group include phenyl, naphthyl, pyridinyl, furanyl, thiophenyl, indolyl, quinolinyl, imidazolinyl, oxazolyl, thiazolyl, tetrahydronaphthyl, and the like, but are not limited thereto.

The weight average molecular weight of the polysilicon having hydroxyl groups at both ends may be 800 to 2,000.

As the polyisocyanate, an aliphatic diisocyanate, an alicyclic diisocyanate, and/or an aromatic diisocyanate may be used.

Examples of the aliphatic diisocyanate include methyl diisocyanate, 1,2-ethanediyl diisocyanate, 1,3-propanediyl diisocyanate, 1,6-hexanediyl diisocyanate, 3-methyl-octane-1,8-diyl diisocyanate and the like.

Examples of the alicyclic diisocyanate include 4,4'-methylenedicyclohexyl diisocyanate, 1,2-cyclopropanediyl diisocyanate, 1,3-cyclobutanediyl diisocyanate, 1,4-cyclohexanediyl diisocyanate, 1,3-cyclohexanediyl diisocyanate, isophorone diisocyanate, 4-methyl-cyclohexane-1,3-diyl diisocyanate, and the like.

Examples of the aromatic diisocyanate include 1,2-phenylene diisocyanate, 1,3-phenylene diisocyanate, 1,4-phenylene diisocyanate, 3-chloro-1,2-benzene diisocyanate, 4-chloro-1,2-benzene diisocyanate, 5-chloro-1,2-benzene diisocyanate, 2-chloro-1,3-benzene diisocyanate, 4-chloro-1,3-benzene diisocyanate, 5-chloro-1,3-benzene diisocyanate, 2-chloro-1,4-benzene diisocyanate, 3-chloro-1,4-benzene diisocyanate, 3-methyl-1,2-benzene diisocyanate, 4-methyl-1,2-benzene diisocyanate, 5-methyl-1,2-benzene diisocyanate, 2-methyl-1,3-benzene diisocyanate, 4-methyl-1,3-benzene diisocyanate, 5-methyl-1,3-benzene diisocyanate, 2-methyl-1,4-benzene diisocyanate, 3-methyl-1,4-benzene diisocyanate, 3-methoxy-1,2-benzene diisocyanate, 4-methoxy-1,2-benzene diisocyanate, 5-methoxy-1,2-benzene diisocyanate, 2-methoxy-1,3-benzene diisocyanate, 4-methoxy-1,3-benzene diisocyanate, 5-methoxy-1,3-benzene diisocyanate, 2-methoxy-1,4-benzene diisocyanate, 3-methoxy-1,4-benzene diisocyanate, 3,4-dimethyl-1,2-benzene diisocyanate, 4,5-dimethyl-1,3-benzene diisocyanate, 2,3-dimethyl-1,4-benzene diisocyanate, 3-chloro-4-methyl-1,2-benzene diisocyanate, 3-methyl-4-chloro-1,2-benzene diisocyanate, 3-methyl-5-chloro-1,2-benzene diisocyanate, 2-chloro-4-methyl-1,3-benzene diisocyanate, 4-chloro-5-methoxy-1,3-benzene diisocyanate, 5-chloro-2-fluoro-1,3-benzene diisocyanate, 2-chloro-3-bromo-1,4-benzene diisocyanate, 3-chloro-5-isopropoxy-1,4-benzene diisocyanate, 2,3-diisocyanate pyridine, 2,4-diisocyanate pyridine, 2,5-diisocyanate pyridine, 2,6-diisocyanate pyridine, 2,5-diisocyanate-3-methylpyridine, 2,5-diisocyanate-4-methylpyridine, 2,5-diisocyanate-6-methylpyridine and the like.

Examples of the (meth)acrylate having a hydroxyl group include (meth)acrylic acid alkyl esters having a hydroxyl group such as 2-hydroxyethyl (meth)acrylate, 2-hydroxypropyl (meth)acrylate, 3-hydroxypropyl (meth)acrylate, 3-hydroxybutyl (meth)acrylate, 4-hydroxybutyl (meth)acrylate, 6-hydroxyhexyl (meth)acrylate and the like; polyfunctional (meth)acrylates having a hydroxyl group such as trimethylolpropane di(meth)acrylate, pentaerythritol tri (meth)acrylate, dipentaerythritol penta(meth)acrylate and the like; polyethylene glycol monoacrylate, polypropylene glycol monoacrylate, and the like.

The silicone urethane (meth)acrylate resin may be prepared, for example, by introducing the polysilicon having hydroxyl groups at both ends and the (meth)acrylate having a hydroxyl group into the reaction system, supplying the polyisocyanate, mixing them, and reacting the mixture under a solvent free condition, or alternatively reacting the polysilicon having hydroxyl groups at both ends and the polyisocyanate to obtain a urethan prepolymer having an isocyanate group, supplying the (meth)acrylate having a hydroxyl group, mixing them, and reacting the mixture under a solvent free condition. The reaction may be carried out at 20 to 120° C. for 30 minutes to 24 hours.

In the preparation of the silicone urethane (meth)acrylate resin, a polymerization inhibitor, an urethanation catalyst and the like may be used, if necessary.

The weight average molecular weight (hereinafter, referred to as "weight average molecular weight") in terms of polystyrene measured by a gel permeation chromatography (GPC, tetrahydrofuran as an elution solvent) of the silicone urethane (meth)acrylate resin is not particularly limited, and for example, it may be 1,500 to 3,000

In one embodiment of the present invention, the silicone urethane (meth)acrylate resin may be contained in an amount of 30 to 50 wt % based on 100 wt % of the total weight of the adhesive composition. If the silicone urethane (meth)acrylate resin is contained in an amount less than 30 wt %, the durability of the adhesive composition may be deteriorated, and if it is contained in an amount exceeding 50 wt %, the coating property of the adhesive composition may be deteriorated.

As the (meth)acrylate ester monomer, an aliphatic (meth)acrylate, a (meth)acrylate having an ether group, a (meth)acrylate having a hydroxyl group, a (meth)acrylamide having a nitrogen atom, and the like may be used, and in particular, an aliphatic (meth)acrylate may be used.

Examples of the aliphatic (meth)acrylate include methyl (meth)acrylate, ethyl (meth)acrylate, propyl (meth)acrylate, isopropyl (meth)acylate, butyl (meth)acrylate, sec-butyl (meth)acrylate, isobutyl (meth)acrylate, 2-ethylbutyl (meth)acrylate, n-pentyl (meth)acrylate, hexyl (meth)acrylate, 2-ethylhexyl (meth)acrylate, heptyl (meth)acrylate, n-octyl (meth)acrylate, nonyl (meth)acrylate, decyl (meth)acrylate, isodecyl (meth)acrylate, dodecyl (meth)acrylate, 3-methylbutyl (meth)acrylate, isooctyl (meth)acrylate, lauryl (meth)acrylate, tridecyl (meth)acrylate, stearyl (meth)acrylate, isostearyl (meth)acrylate, neopentyl (meth)acrylate, hexadecyl (meth)acrylate, isoamyl (meth)acrylate and the like. In particular, a $C_{10}$-$C_{20}$ alkyl (meth)acrylate such as lauryl (meth)acrylate, isodecyl (meth)acrylate and the like may be preferably used.

Examples of the (meth)acrylate having an ether group include 3-methoxybutyl (meth)acrylate, 2-methoxyethyl (meth)acrylate, 3-methoxypropyl (meth)acrylate, 2-methoxybutyl (meth)acrylate, methoxy polyethylene glycol acrylate having an addition mole number of oxyethylene ranging from 1 to 15, ethoxy-diethylene glycol (meth)acrylate, ethyl carbitol (meth)acrylate and the like.

Examples of the (meth)acrylate having a hydroxyl group include 2-hydroxyethyl (meth)acrylate, 2-hydroxypropyl (meth)acrylate, 4-hydroxybutyl (meth)acrylate and the like.

Examples of the (meth)acrylamide having a nitrogen atom include (meth)acrylamide, dimethyl (meth)acrylamide, acryloylmorpholine, dimethylaminopropyl (meth)acrylamide, isopropyl (meth)acrylamide, diethyl (meth)acrylamide, hydroxyethyl (meth)acrylamide, diacetone (meth)acrylamide and the like.

In one embodiment of the present invention, the (meth)acrylate ester monomer may be contained in an amount of 45 to 70 wt % based on 100 wt % of the total weight of the adhesive composition. If the content of the (meth)acrylate ester monomer satisfies the above range, the tan δ and storage elastic modulus at −20° C. may be controlled within an appropriate range.

The photoinitiator refers to an initiator that absorbs an active energy ray to generate a radical. Specific examples of the photoinitiator include benzoin compounds, benzophenone compounds, thioxanthone compounds, acetophenone compounds, and the like.

The photoinitiator may be contained in an amount of 0.01 to 5.0 wt % based on 100 wt % of the total weight of the adhesive composition. If the photoinitiator is contained in an amount less than 0.01 wt %, it may be difficult to effectively initiate the crosslinking reaction. If the photoinitiator is contained in an amount exceeding 5.0 wt %, discoloration or the like may occur due to residual initiator, thereby causing a deterioration of durability.

According to one embodiment of the present invention, as the first and second adhesive layers 50, 90 are inserted into respective layers or respective elements included in the flexible display device, a strain separation may occur when a stress such as tension or compression is generated in the flexible display device.

Thus, a neutral plane (NP) may be formed in respective layers or respective elements included in the flexible display device.

As illustrated in FIG. 1, a first neutral plane (NP1) may be formed in a display panel 100, a second neutral plane (NP2) may be formed in a functional structure 200, and a third neutral plane (NP3) may be formed in a window 300.

The tan δ of the first and second adhesive layers 50, 90 at −20° C. may be adjusted so that the neutral planes are formed by the strain separation through the first and second adhesive layers 50, 90 at a low temperature of −20° C. As described above, the neutral planes are formed in the respective elements of the flexible display device by the first and second adhesive layers 50, 90 at a low temperature of −20° C. and therefore, the bending property may be improved at a low temperature of −20° C., and damage caused by stress in the respective layers of the display panel 100, the functional structure 200, and the window 300 may be suppressed.

The formation of the neutral planes through the first and second adhesive layers 50, 90 will be described below in detail with reference to FIG. 4.

FIG. 2 is a cross-sectional view schematically illustrating the display panel of the flexible display device according to one embodiment of the present invention.

Referring to FIG. 2, the display panel 100 may include a thin film transistor (TFT), an insulating structure, a pixel electrode 145, and a display layer 160 disposed on a panel substrate 105.

The panel substrate 105 may be provided as a base substrate of the display panel 100. The panel substrate 105 may include, for example, a flexible resin material such as polyimide.

The thin film transistor may include an active layer 110, a gate electrode 120, a source electrode 132, and a drain electrode 134. The insulating structure may include a gate insulating film 115, an interlayer insulating film 125, and a via-insulating film 140.

The active layer 110 may be formed on the upper surface of the panel substrate 105 and may include polysilicon or an oxide semiconductor (for example, indium gallium zinc oxide (IGZO) or the like). The gate insulating film 115 may be formed on the panel substrate 105 and may cover the active layer 110.

The gate electrode 120 may be disposed on the gate insulating film 115 and may overlay the active layer 110. The gate electrode 120 may include a metal such as Al, Ti, Cu, W, Ta, or Ag.

After an interlayer insulating film 125 covering the gate electrode 120 is formed on the gate insulating film 115, a source electrode 132 and a drain electrode 134 which make a contact with the active layer 110 may be formed by penetrating the interlayer insulating film 125 and the gate insulating film 115. The source electrode 132 and the drain electrode 134 may include a metal such as Al, Ti, Cu, W, Ta, or Ag.

A via insulating film 140 which overlays the source electrode 132 and the drain electrode 134 may be formed on the interlayer insulating film 125. The via insulating film 140 may be formed using an organic insulating material such as an acrylic-based resin, a siloxane-based resin, or the like A pixel electrode 145 that is electrically connected to the drain electrode 134 may be formed on the via insulating film 140. The pixel electrode 145 may include a via portion making a contact with the drain electrode 134 by penetrating the via insulating film 140. The pixel electrode 145 may include a metal such as Al, Ti, Cu, W, Ta or Ag, and/or a transparent conductive oxide (for example, indium tin oxide (ITO)).

A pixel defining film 150 may be formed on the via insulating film 140, and a display layer 160 may be formed on the upper surface of the pixel electrode 145 exposed by the pixel defining film 150. The display layer 160 may be formed, for example, as an organic emissive layer (EML) contained in an OLED device or a liquid crystal layer contained in an LCD device.

A counter electrode 170 may be formed on the pixel defining film 150 and the display layer 160. The counter electrode 170 may be provided as a common electrode, a reflective electrode, or a cathode of an image display device.

The display panel 100 includes a plurality of pixels, and the thin film transistor and the pixel electrode 145 may be arranged for each pixel. The counter electrode 170 may be provided as a common electrode that continuously extends on a plurality of pixels.

An encapsulation layer 180 may be formed on the counter electrode 170. The encapsulation layer 180 may include an inorganic insulating material such as silicon oxide, silicon nitride, and/or an organic insulating material such as acryl-based, siloxane-based, urethane-based resin or the like.

The display panel 100 may further include a pixel circuit which is electrically connected to the thin film transistor. For example, the pixel circuit may include a data line, a scan line, a power supply line, and the like, and each pixel may be independently defined for every intersection of the data line and the scan line.

As described above, the first neutral plane (NP1) is formed inside the display panel 100 at a low temperature of −20° C., and thus, damage such as cracks, breakage or the like of the pixel circuit, the thin film transistor, and the electrode may be suppressed when the display panel is bent at a low temperature of −20° C.

The thickness of the display panel 100 may be 80 to 400 μm.

FIG. 3 is a plan view schematically illustrating a touch sensor of the flexible display device according to one embodiment of the present invention. For example, the touch sensor may be applied to the functional structure 200 in the form of a touch screen panel or a touch sensor film.

Referring to FIG. 3, the touch sensor may include a sensing electrode 210, a trace 220, and a pad 230 formed on a substrate 205.

The touch sensor may include a sensing area (A) and a peripheral area (B). The sensing electrode 210 may be formed on the substrate 205 of the sensing area (A), and the trace 220 and the pad 230 may be formed on the substrate 205 of the peripheral area (B).

The sensing electrode 210 may include, for example, a first sensing electrode 210a and a second sensing electrode 210b arranged along a first direction and a second direction that are parallel to the upper surface of the substrate 205 and intersect perpendicularly to each other.

The first sensing electrode 210a may extend in the first direction, and a plurality of first sensing electrodes 210a may be formed along the second direction. The second sensing electrode 210b may extend in the second direction, and a plurality of second sensing electrodes 210b may be formed along the first direction.

Each of the first and second sensing electrodes 210a, 210b may include, for example, a unit pattern in polygonal shape, and may include a connection unit or a bridge electrode that connects neighboring unit patterns. The inside of the unit pattern may include a conductive pattern patterned in a mesh type.

The trace 220 may be branched from the respective sensing electrodes 210a, 210b, and the terminal of the trace 220 may be connected to a pad 230. The touch sensor may be connected, for example, to an external circuit such as a flexible printed circuit board (FPCB) through the pad 230.

As described above, the second neutral plane (NP2) is formed inside the touch sensor at a low temperature of −20° C. Thus, damage such as breakage, cracks or the like of the sensing electrode 210, the bridge electrode, and the trace 220 may be prevented when it is bent at a low temperature of −20° C.

FIG. 4 is a graph illustrating a strain profile of the flexible display device according to one embodiment of the present invention.

Referring to FIG. 4, when the flexible display device is bent at a low temperature of −20° C. the neutral plane may be formed in each of the display panel 100, the functional structure 200, and the window 300, as described with reference to FIG. 1.

As used herein, the term "neutral plane" is defined as a surface in which a compressive stress (denoted by "−" in FIG. 4) and a tensile stress (denoted by "+" in FIG. 4) are substantially the same when the flexible display device is bent. Accordingly, the strain can be converged substantially to zero on the neutral plane.

When the flexible display device is bent, a compressive force may be applied on the inner side on which it is bent, and a tensile force is applied on the outer side, and thus, damage may occur in the internal structure thereof.

According to one embodiment of the present invention, when the flexible display device is bent at a low temperature of −20° C., the optical elements or the information transfer elements included in the flexible display device all include the neutral plane, and therefore, the compressive force and the tensile force are internally offset, so that breakage, crack and damage of the internal structure can be prevented. Thus, the range within which the flexible display device can be curved or bent at a low temperature of −20° C. may be extended, thereby improving both flexibility and mechanical reliability.

As illustrated in FIG. 4, a strain separation may be generated by the first adhesive layer 50 between the display panel 100 and the functional structure 200, and thus, the first neutral plane (NP1) and the second neutral plane (NP2) may be formed in the display panel 100 and the functional structure 200, respectively.

In addition, a strain separation may be generated by the second adhesive layer 90 between the functional structure 200 and the window 300, and thus, the third neutral plane (NP3) may be formed in the window 300.

In one embodiment of the present invention, the total thickness of the flexible display device may range from 200 to 1,000 μm.

FIG. 5 is a cross-sectional view schematically illustrating the flexible display device according to another embodiment of the present invention.

Referring to FIG. 5, the functional structure may comprise a touch sensor 200a and a polarizing layer 200b. Further, a third adhesive layer 70 may be formed between the touch sensor 200a and the polarizing layer 200b.

The third adhesive layer 70 may have a tan δ of 0.8 to 1 at −20° C. Accordingly, the bending resistance and durability of the flexible display device comprising the third adhesive layer 70 may be improved.

In addition, the storage elastic modulus of the third adhesive layer 70 at −20° C. may be 0.05 to 0.15 MPa. If the storage elastic modulus of the third adhesive layer 70 at −20° C. is less than 0.05 MPa, the durability may be deteriorated. If the storage elastic modulus is higher than 0.15 MPa, the bending resistance may be deteriorated.

The thickness of the third adhesive layer 70 may be 5 to 30 μm.

An adhesive composition for forming the third adhesive layer 70 may be the same as the adhesive compositions for forming the first and second adhesive layers 50, 90.

When the flexible display device is bent at a low temperature of −20° C., a strain separation between the touch sensor 200a and the polarizing layer 200b may be promoted by the third adhesive layer 70, and thus, a neutral plane may be formed inside of each of the touch sensor 200a and the polarizing layer 200b.

For example, a second neutral plane (NP2) may be formed inside the touch sensor 200a, and a third neutral plane (NP3) may be formed inside the polarizing layer 200b. A fourth neutral plane (NP4) may be formed inside the window 300 by the strain separation through the second adhesive layer 90 as described above.

FIG. 6 is a cross-sectional view schematically illustrating the flexible display device according to still another embodiment of the present invention.

Referring to FIG. 6, the flexible display device may further comprise, for example, a protective film 350 exposed to the user viewing side, as an outermost layer. For example, the protective film 350 may be laminated on the window 300.

In one embodiment of the present invention, the protective film 350 may be adhered on the upper surface of the window 300 through a fourth adhesive layer 80.

The fourth adhesive layer 80 may have a tan δ of 0.8 to 1 at −20° C., as in the first and second adhesive layers 50, 90 described above. Accordingly, the bending resistance and durability of the flexible display device comprising the fourth adhesive layer 80 may be improved.

In addition, the storage elastic modulus of the fourth adhesive layer 80 may be 0.05 to 0.15 MPa at −20° C. If the storage elastic modulus of the fourth adhesive layer 80 is less than 0.05 MPa at −20° C., the durability may be deteriorated. If the storage elastic modulus is higher than 0.15 MPa, the bending resistance may be deteriorated.

The thickness of the fourth adhesive layer 80 may be 5 to 30 μm.

An adhesive composition for forming the fourth adhesive layer 80 may be the same as the adhesive compositions for forming the first and second adhesive layers 50, 90.

The protective film 350 may include a flexible resin film, and for example, it may include a polyimide film. The protective film 350 may have a thickness of 20 to 50 μm.

When the flexible display device is bent at a low temperature of −20° C., a neutral plane (for example, the fourth neutral plane (NP4)) may be formed inside the protective film 350 by the fourth adhesive layer 80. Therefore, the durability and crack resistance of the protective film 350 against an external impact can be further improved, thereby protecting the flexible display device.

Hereinafter, the present invention will be described in more detail by way of Examples, Comparative Examples and Experimental Examples. However, these Examples, Comparative Examples and Experimental Examples are given for illustrating the present invention only, and it will be apparent to those skilled in the art that the scope of the invention is not intended to be limited thereto.

Preparation Example 1: Preparation of Silicone Urethan (meth)acrylate Resin

To a 2 L three-necked flask equipped with an electric stirrer, a heating mantle, a cooling tube and a temperature controller. Polyisocyanate, polysilicon having hydroxyl groups at both ends, and dibutyltin dilaurate as a catalyst were added in the composition (unit: parts by weight) shown in Table 1 below, the reaction temperature was raised to 70° C. while stirring, and the reaction was continued for 4 hours. Then, (meth)acrylate having a hydroxyl group and methoxyhydroquinone as a polymerization inhibitor were added dropwise in the composition shown in Table 1 below and allowed to react. After completion of the addition, the reaction was continued for 2 hours. When the peak at 2260 $cm^{-1}$, which is a characteristic peak of NCO on the FT-IR, disappears, the reaction was terminated to obtain a silicone urethane (meth)acrylate resin.

TABLE 1

|  | Preparation Example 1 |
| --- | --- |
| Polyisocyanate [1] | 524 |
| Polysilicon having hydroxyl groups at both ends [2] | 933 |
| Dibutyltin dilaurate | 0.4 |
| Methoxyhydroquinone | 0.3 |
| (Meth)acrylate having a hydroxyl group [3] | 232 |

[1] 4,4'-methylene dicyclohexyl diisocyanate (molecular weight of 262)
[2] X-22-160AS (Shin-Etsu, molecular weight of 933)
[3] 2-hydroxyethyl acrylate (molecular weight of 116)

Preparation Example 2: Preparation of (meth)acrylate Syrup

To a 1 L reactor with nitrogen gas refluxed and an installed refrigerator to easily regulate a temperature, 2-ethylhexyl acrylate (2-EHA) monomer was added, and nitrogen gas was purged for 1 hour to remove oxygen, and then the temperature was maintained at 80° C. 0.5 parts by weight of 1-hydroxycyclohexyl phenyl ketone as a photoinitiator was added based on 100 parts by weight of the monomer. Subsequently, the reaction mixture was irradiated with a UV lamp (10 mW) while stirring to prepare a (meth)acrylate syrup having a solid content of 40 wt %, that is, a mixture of 40 parts by weight of (meth)acrylate polymer and 60 parts by weight of 2-ethylhexyl acrylate (2-EHA) monomer. It was then used in the form of the (meth)acrylate syrup in a subsequent preparation of the adhesive composition.

Preparation Example 3: Preparation of (meth)acrylate Syrup

To a 1 L reactor with nitrogen gas refluxed and an installed refrigerator to easily regulate a temperature, n-butyl acrylate (BA) monomer was added, and nitrogen gas was purged for 1 hour to remove oxygen, and then the temperature was maintained at 80° C. 0.5 parts by weight of 1-hydroxycyclohexyl phenyl ketone as a photoinitiator was added based on 100 parts by weight of the monomer. Subsequently, the reaction mixture was irradiated with a UV lamp (10 mW) while stirring to prepare a (meth)acrylate syrup having a solid content of 40 wt %, that is, a mixture of 40 parts by weight of (meth)acrylate polymer and 60 parts by weight of n-butyl acrylate (BA) monomer. It was then used in the form of the (meth)acrylate syrup in a subsequent preparation of the adhesive composition.

Preparation Example 4: Preparation of (meth)acrylate Syrup

To a 1 L reactor with nitrogen gas refluxed and an installed refrigerator to easily regulate a temperature, tetrahydrofurfuryl acrylate (THFA) monomer was added, and nitrogen gas was purged for 1 hour to remove oxygen, and then the temperature was maintained at 80° C. 0.5 parts by weight of 1-hydroxycyclohexyl phenyl ketone as a photoinitiator was added based on 100 parts by weight of the monomer. Subsequently, the reaction mixture was irradiated with a UV lamp (10 mW) while stirring to prepare a (meth)acrylate syrup having a solid content of 40 wt %, that is, a mixture of 40 parts by weight of (meth)acrylate polymer and 60 parts by weight of tetrahydrofurfuryl acrylate (THFA) monomer. It was then used in the form of the (meth)acrylate syrup in a subsequent preparation of the adhesive composition.

Examples 1 to 5 and Comparative Examples 1 to 4: Preparation of Flexible Display Device The adhesive compositions were prepared by mixing the respective components in the composition shown in Table 2 below (unit: wt %)

The respective adhesive compositions prepared above were coated onto a releasing film coated with a silicone releasing agent so that the thickness thereof is 25 μm, and a releasing film was adhered thereto, and then the resultant was irradiated at a light intensity of 500 mJ/cm$^2$ using a high pressure mercury UV lamp to prepare respective adhesive sheets.

A pixel electrode, an organic emissive layer (display layer), a counter electrode, and an encapsulation layer were sequentially formed on a panel substrate (polyimide, thickness of 30 μm) having a width and a length of 10 cm each, thereby preparing a display panel having a total thickness of 120 μm.

The respective adhesive sheets prepared above were laminated on the display panel to form a first adhesive layer.

Next, a touch sensor (including an ITO electrode pattern layer formed on a TAC film) and a polarizing plate including a stretched polarizer (which is a PVA polarizer film obtained by adhering a TAC protective film on both surfaces thereof and a retardation film was attached to one surface thereof) were laminated on the first adhesive layer to form a functional structure. The thickness of the total functional structure was 100 rm.

The respective adhesive sheets prepared above were laminated on the functional structure to form a second adhesive layer.

A window substrate (polyimide, thickness of 70 μm) was further laminated on the second adhesive layer to prepare a flexible display device.

Experimental Example 1: Evaluation of Physical Properties of Flexible Display Device The physical properties of the flexible display devices prepared in Examples and Comparative Examples were measured by the following methods, and the results are shown in Table 3 below.

(1) Tangent Delta and Storage Elastic Modulus (G')

Tangent delta and storage elastic modulus (G') were measured at −20° C. using a viscoelasticity measuring device (MCR-301, manufactured by Anton Paar). Specifically, the sample size of the adhesive sheets prepared in Examples and Comparative Examples was made into a size of 30 mm length×30 mm wide. The measurement sample was adhered to a glass plate, and then the tangent delta and

TABLE 2

| | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Silicone urethane (meth)acrylate resin of Preparation Example 1 | 40 | 50 | 30 | — | — | 70 | 75 | 5 | — |
| (Meth)acrylate polymer of Preparation Example 2 | — | — | — | 28 | 16 | — | — | — | — |
| (Meth)acrylate polymer of Preparation Example 3 | — | — | — | 8 | 16 | — | — | — | — |
| (Meth)acrylate polymer of Preparation Example 4 | — | — | — | — | — | — | — | — | 38.8 |
| Photoinitiator[1] | 3 | 3 | 3 | 3 | 3 | 3 | 3 | 3 | 3 |
| Lauryl acrylate | 30 | 25 | 50 | 7 | — | — | 12 | 45 | — |
| Isodecyl acrylate | 27 | 22 | 17 | — | 17 | 27 | 10 | 47 | — |
| 2-Ethylhexyl acrylate | — | — | — | 42 | 24 | — | — | — | — |
| n-Butyl acrylate | — | — | — | 12 | 24 | — | — | — | — |
| Tetrahydrofurfuryl acrylate | — | — | — | — | — | — | — | — | 58.2 |

[1]1-hydroxycyclohexyl phenyl ketone storage elastic modulus were measured under a condition with a frequency of 1.0 Hz and deformation of 2% while it was adhered to a measuring tip. The tangent delta is a value calculated by G"(loss elastic modulus)/G'(storage elastic modulus).

(2) Bending Resistance

The bending resistance was evaluated using a folding tester (DLDMLH-FS, manufactured by YUASA). The flexible display devices prepared in Examples and Comparative Examples were cut into a size of 100 mm×10 mm to prepare samples. When the samples were mounted on the tester, each sample was reversely adhered so that a bending tensile was applied to the organic light emitting layer of one sample and a bending compressive stress was applied to the organic light emitting layer of another sample. The samples were mounted on the tester, and then 200,000 cycles of evaluation were conducted under a condition of 3R and a rate of 30 cycles/min.

Then, the bending part of the sample was observed by an optical microscope (ECLIPSE LV100ND, manufactured by NIKON), and the bending resistance was evaluated based on the following criteria.

<Evaluation Criteria>

⊚: No crack

○: the number of cracks is equal to or less than 5, and it does not grow to the full length in the width direction Δ: the number of cracks is more than 5 and not more than 10, and it does not grow to the full length in the width direction x: the number of cracks is equal to or more than 11, and cracks exist in the full length of the width direction (3) Mandrel In order to evaluate the bending properties, the flexible display devices prepared in Examples and Comparative Examples were cut into a size of 1 cm×10 cm to prepare samples. The samples were each placed on steel rods having each diameter of 2φ to 20φ, and the window substrate was directed downward and was folded by hand, and the smallest diameter at which no crack or streak appears on the surface was indicated.

(4) Heat Resistance Durability

The heat resistance durability was evaluated based on the following criteria by allowing the flexible display devices prepared in Examples and Comparative Examples to stand at a temperature of 100° C. for 500 hours and then observing whether bubbles or peeling occurred.

<Evaluation Criteria>

⊚: No bubble or peeling

○: less than 5 bubbles or peeling

Δ: equal to or more than 5 and less than 10 bubbles or peeling x: equal to or more than 10 bubbles or peeling

TABLE 3

|  | Tan δ | G'(MPa) | Bending resistance | Mandrel | Heat resistance durability |
| --- | --- | --- | --- | --- | --- |
| Example 1 | 0.9 | 0.1 | ⊚ | 3φ | ⊚ |
| Example 2 | 0.8 | 0.14 | ⊚ | 4φ | ⊚ |
| Example 3 | 1 | 0.07 | ⊚ | 2φ | ⊚ |
| Example 4 | 0.9 | 0.09 | ⊚ | 3φ | ⊚ |
| Example 5 | 0.8 | 0.13 | ⊚ | 3φ | ⊚ |
| Comparative Example 1 | 0.6 | 0.7 | X | 11φ | X |
| Comparative Example 2 | 0.4 | 0.8 | X | 14φ | X |
| Comparative Example 3 | 2 | 0.01 | X | 10φ | X |
| Comparative Example 4 | 0.3 | 1.1 | X | 20φ | X |

As shown in Table 3, it was confirmed that the flexible display devices of Examples 1 to 5 including the first adhesive layer and the second adhesive layer having a tan δ of 0.8 to 1 at −20° C. had excellent bending resistance and durability. In contrast, it was also confirmed that the flexible display devices of Comparative Examples 1 to 4 including the first adhesive layer and the second adhesive layer in which the tan δ at −20° C. is out of the range of 0.8 to 1 had poor bending resistance and durability.

Although specific parts of the present invention have been described in detail, it will be apparent to those skilled in the art that these specific techniques are merely a preferred embodiment and that the scope of the present invention is not limited thereto. In addition, those skilled in the art will appreciate that various applications and modifications can be made, without departing from the scope and spirit of the invention based on the description above.

Therefore, the substantial scope of the present invention will be defined by the accompanying claims and their equivalents.

REFERENCE NUMERALS

50: First adhesive layer
70: Third adhesive layer
80: Fourth adhesive layer
90: Second adhesive layer
100: Display panel
105: Panel substrate
110: Active layer
115: Gate insulating film
120: Gate electrode
125: Interlayer insulating film
132: Source electrode
134: Drain electrode
140: Via insulating film
145: Pixel electrode
150: Pixel defining film
160: Display layer
170: Counter electrode
180: Encapsulation layer
200: Functional structure
200a: Touch sensor
200b: Polarizing layer
205: Substrate
210: Sensing electrode
210a: First sensing electrode
210b: Second sensing electrode
220: Trace
230: Pad
300: Window
350: Protective film

The invention claimed is:

1. A flexible display device comprising:
a display panel;
a functional structure disposed on the display panel;
a window disposed on the functional structure;

a first adhesive layer formed between the display panel and the functional structure; and a second adhesive layer formed between the functional structure and the window, wherein the first adhesive layer and the second adhesive layer each have a tan δ of 0.8 to 1 at −20° C., wherein the first adhesive layer and the second adhesive layer each have a storage elastic modulus of 0.05 to 0.15 MPa at −20° C., wherein each of the first adhesive layer and the second adhesive layer are formed from an adhesive composition comprising an aliphatic (meth)acrylate polymer, a (meth)acrylate ester monomer, and a photoinitiator, and wherein the (meth)acrylate ester monomer comprises a $C_{10}$-$C_{20}$ alkyl (meth)acrylate.

2. The flexible display device of claim 1, wherein the display panel comprises an organic light emitting diode panel or a liquid crystal display panel.

3. The flexible display device of claim 1, wherein the functional structure comprises at least one of a touch sensor, a polarizing layer, and a retardation layer.

4. The flexible display device of claim 1, wherein the window comprises a substrate layer and a hard coating layer formed on at least one side of the substrate layer.

5. The flexible display device of claim 1, wherein the (meth)acrylate ester monomer is contained in an amount of 45 to 70 wt % based on 100 wt % of the total weight of the adhesive composition.

6. The flexible display device of claim 1, wherein the functional structure comprises a touch sensor, a polarizing layer, and a third adhesive layer, wherein the third adhesive layer is formed between the touch sensor and the polarizing layer, and wherein the third adhesive layer has a tan δ of 0.8 to 1 at −20° C.

7. The flexible display device of claim 1, further comprising a protective film disposed on the window.

8. The flexible display device of claim 7, further comprising a fourth adhesive layer formed between the window and the protective film, wherein the fourth adhesive layer has a tan δ of 0.8 to 1 at −20° C.

\* \* \* \* \*